(12) United States Patent
Oh et al.

(10) Patent No.: US 8,159,064 B2
(45) Date of Patent: Apr. 17, 2012

(54) LEAD PIN FOR PACKAGE SUBSTRATE, AND METHOD FOR MANUFACTURING PACKAGE SUBSTRATE WITH THE SAME

(75) Inventors: Heung Jae Oh, Chungcheongnam-do (KR); Jin Won Choi, Yongin-si (KR); Ki Taek Lee, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 12/926,626

(22) Filed: Nov. 30, 2010

(65) Prior Publication Data
US 2012/0043653 A1 Feb. 23, 2012

(30) Foreign Application Priority Data

Aug. 19, 2010 (KR) .................. 10-2010-0080303

(51) Int. Cl.
*H01L 23/48* (2006.01)
(52) U.S. Cl. ............... 257/697; 257/784; 257/E23.024; 438/107
(58) Field of Classification Search .................. 257/697, 257/784, E23.024; 438/107
See application file for complete search history.

(56) References Cited

U.S. PATENT DOCUMENTS

| 6,359,332 | B2 * | 3/2002 | Shiraishi | 257/697 |
| 7,422,449 | B2 * | 9/2008 | Ide et al. | 439/83 |
| 2011/0014827 | A1 * | 1/2011 | Oh et al. | 439/884 |
| 2011/0103029 | A1 * | 5/2011 | Kitajima | 361/774 |

FOREIGN PATENT DOCUMENTS

| JP | 4-355955 | 12/1992 |
| JP | 2003-208938 | 7/2003 |
| KR | 10-2007-0068345 | 6/2007 |

OTHER PUBLICATIONS

Korean Office Action dated Jan. 2, 2012 issued in corresponding Korean Patent Application No. 10-2010-0080303.

* cited by examiner

*Primary Examiner* — Trung Q Dang

(57) ABSTRACT

Disclosed herein is a lead pin for a package substrate. The lead pin for the package substrate according to the exemplary embodiment of the present invention includes a head part having one surface opposite to the package substrate and the other surface that is an opposite side to the one surface; and a connection pin having a pin shape bonded to the other surface of the head part, wherein the head part has a concave depression part toward the package substrate.

16 Claims, 5 Drawing Sheets

[FIG. 1]
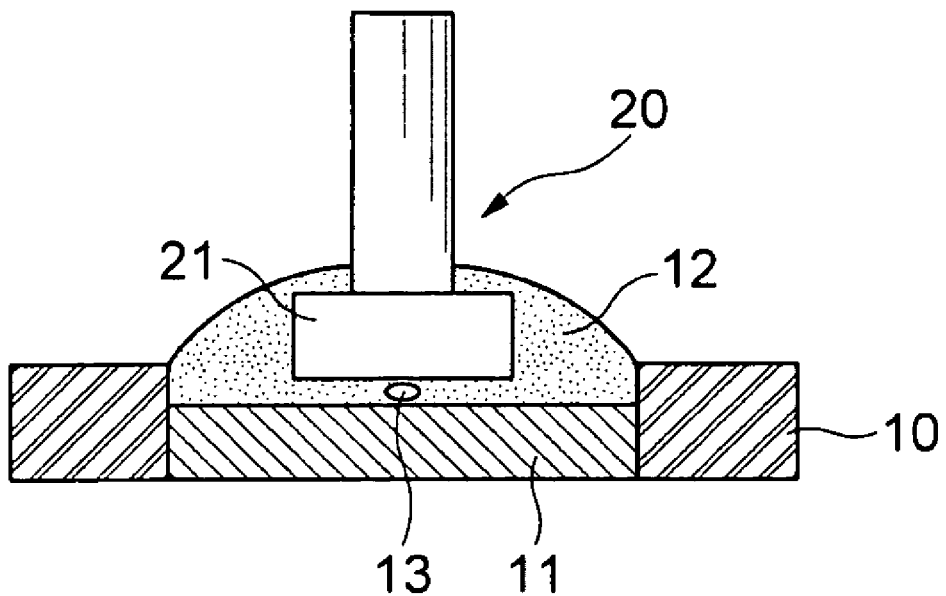
- PRIOR ART -
[FIG. 2]
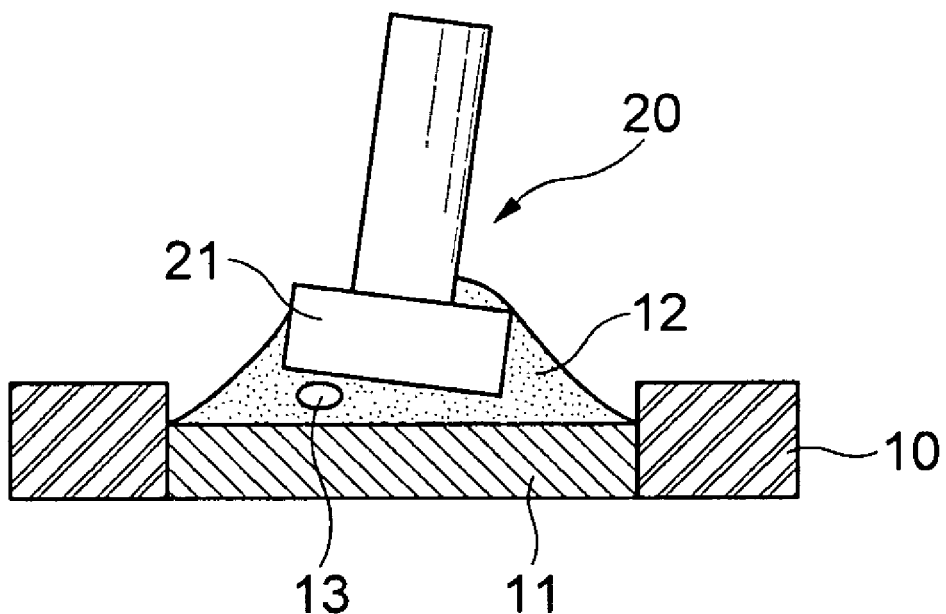
- PRIOR ART -

[FIG. 3]
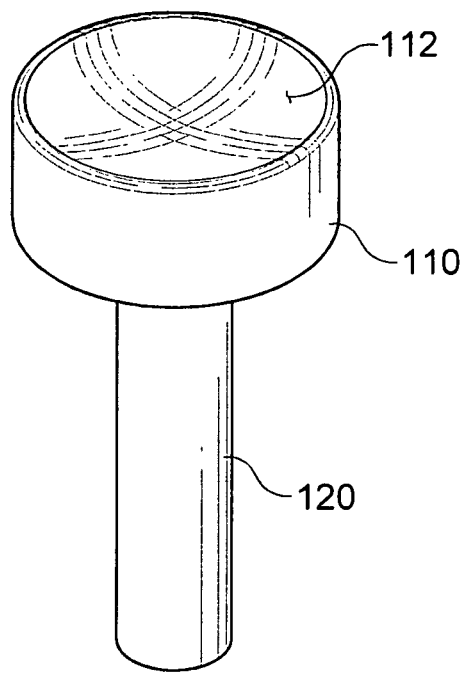
[FIG. 4]
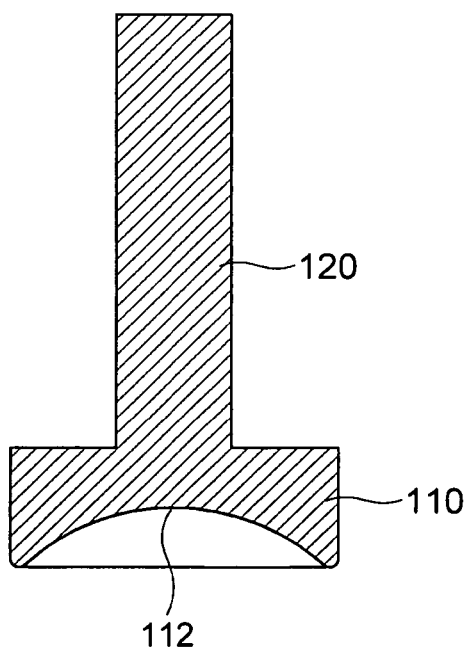

[FIG. 5]
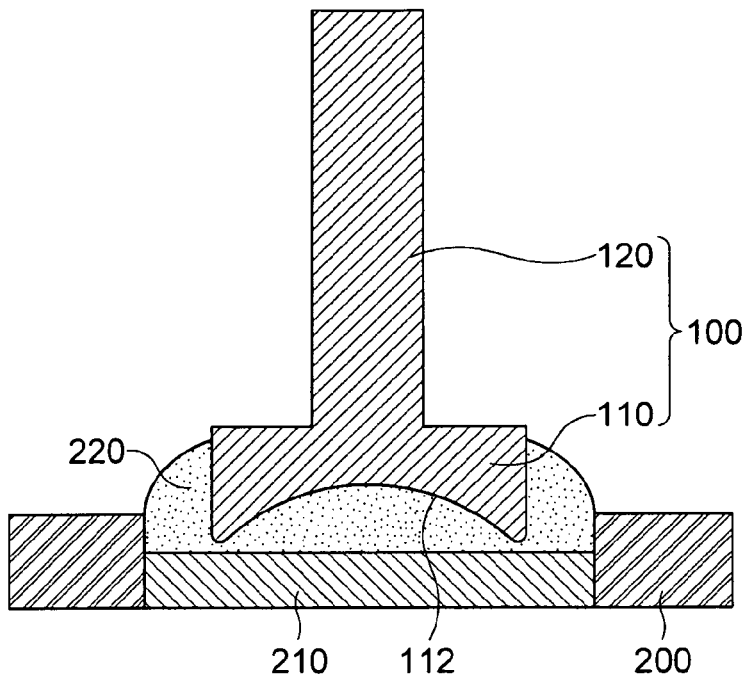
[FIG. 6]
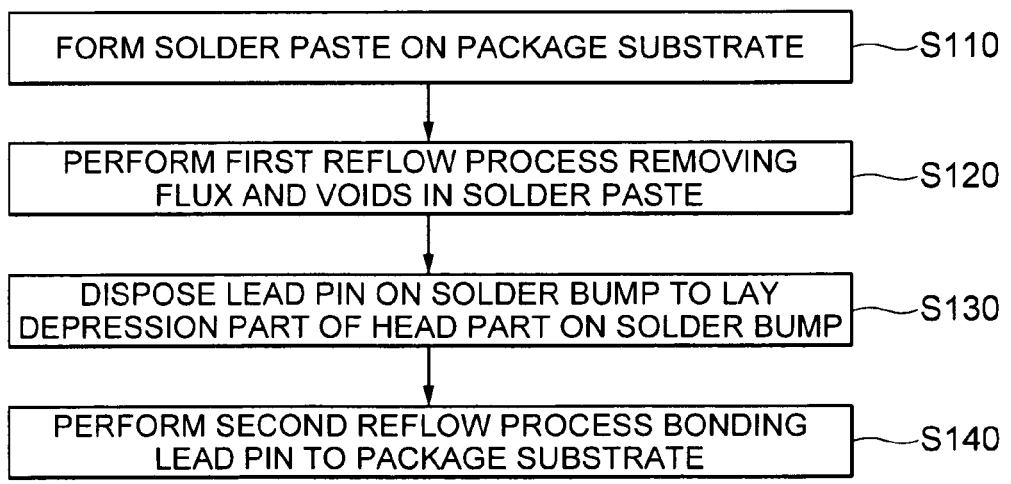
[FIG. 7]
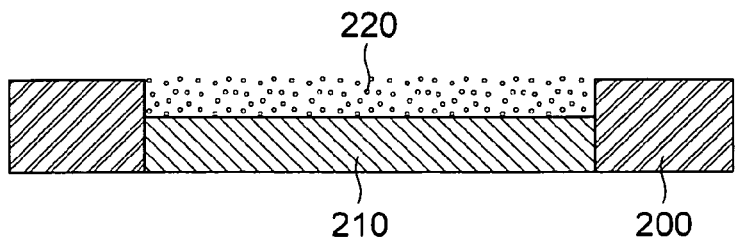

[FIG. 8]
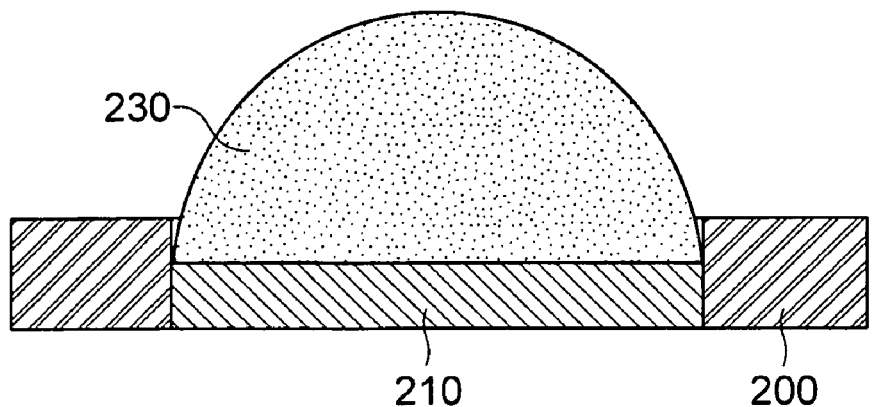
[FIG. 9]
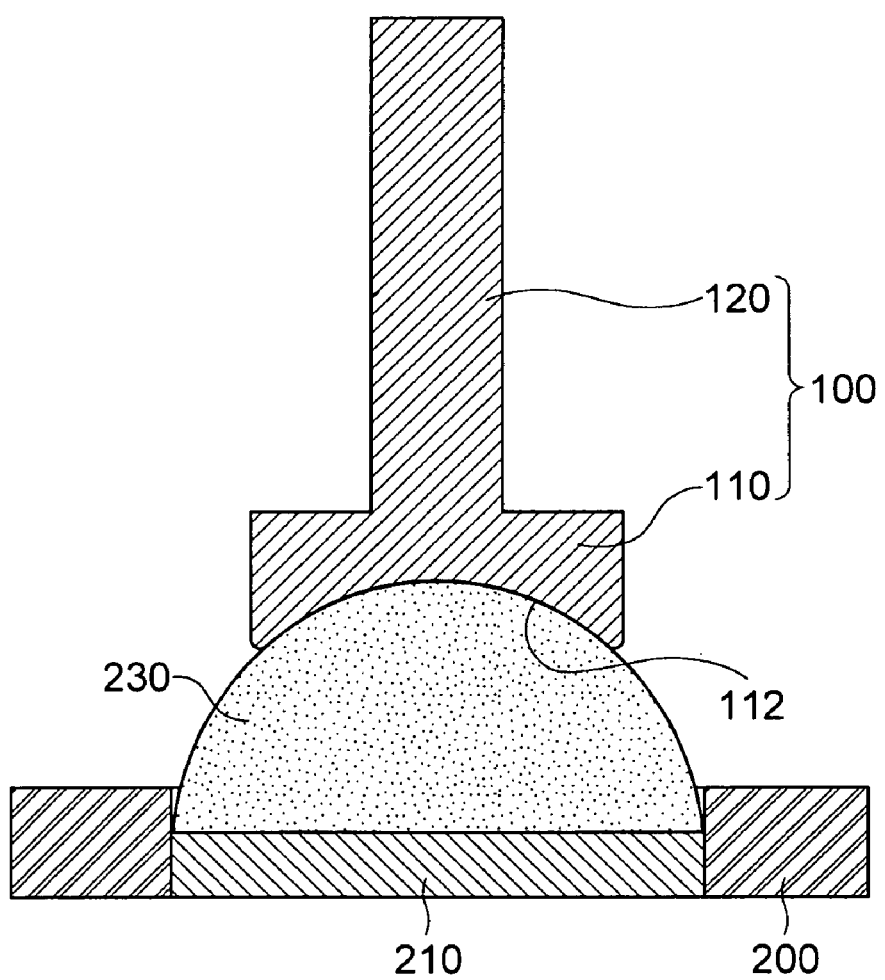

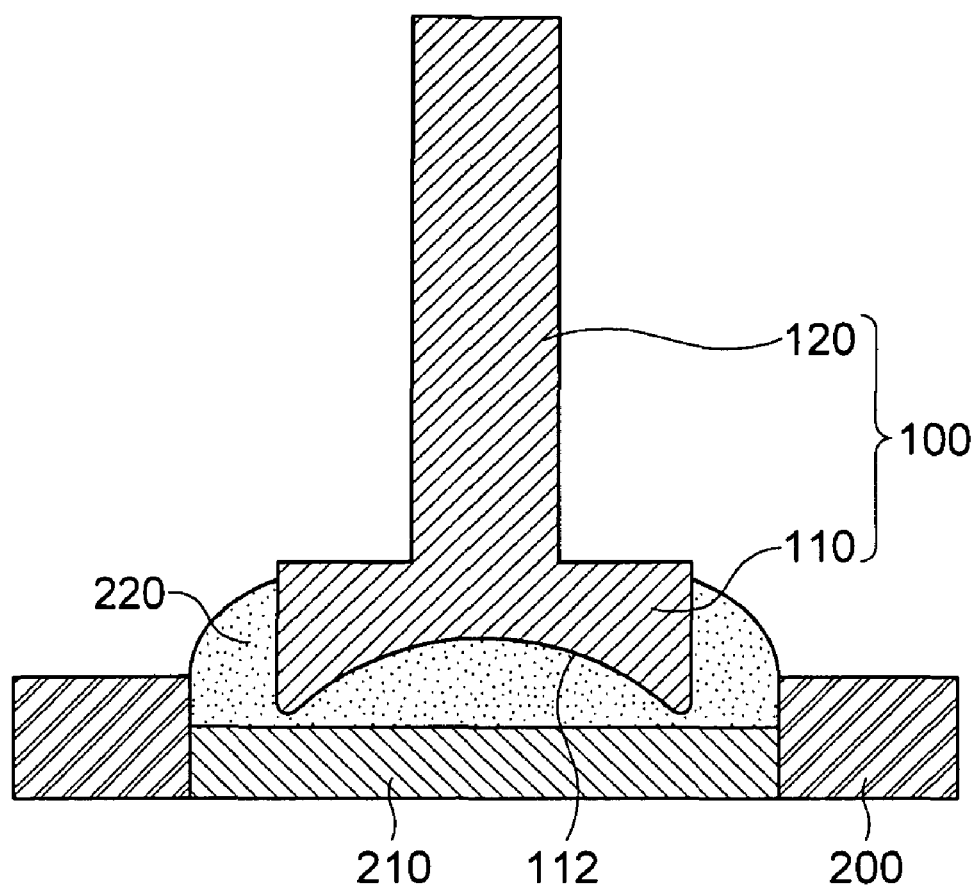
[FIG. 10]

LEAD PIN FOR PACKAGE SUBSTRATE, AND METHOD FOR MANUFACTURING PACKAGE SUBSTRATE WITH THE SAME

CROSS REFERENCE TO RELATED APPLICATION

This application claims the benefit under 35 U.S.C. Section [120, 119, 119(e)] of Korean Patent Application Serial No. 10-2010-0080303, entitled "Lead Pin For Package Substrate, And Method For Manufacturing Package Substrate With The Same" filed on Aug. 19, 2010, which is hereby incorporated by reference in its entirety into this application.

BACKGROUND OF THE INVENTION

1. Technical Field

The present invention relates to a lead pin for a package substrate and a method for manufacturing a package substrate with the same, and more particularly, to a lead pin for a package substrate capable of improving bonding reliability with the package substrate and a method for manufacturing a package substrate with the same.

2. Description of the Related Art

With the development of the electronics industry, various types of semiconductor packages have been manufactured. Recently, a package substrate in a Pin Grid Array (PGA) type mounted with a plurality of T-type lead pins has been prevalently used, as a substrate that connects a package substrate, on which an integrated circuit (IC) is mounted, to a main board.

As a lead pin used in a general package substrate, an insertable lead pin where a pin is inserted into a hole formed on the package substrate and a T-type lead pin that is attached to a package substrate by soldering have been prevalently used. However, the T-type lead pin has gradually become widespread due to less limitation in a circuit configuration of a package substrate, as compared to the insertable lead pin.

However, the T-type lead pin has disadvantages in that the lead pin is inclined or it is difficult to maintain uniform bonding strength. In particular, as the use of lead has been recently limited in consideration of the environment, a solder (Sn—Ag—Cu, and Sn—Sb) not using lead has been used, but the melting temperature of the solder is increased. In this case, a solder for connecting lead pins that support the lead pins is melted by reflow heat during a reflow process for mounting an IC chip on a package substrate, thereby causing inclination of the lead pins. In addition, voids are generated between a head part of the lead pin and the solder at the time of soldering the existing T-type lead pins, and as a result, the bonding reliability of the lead pins is deteriorated.

The foregoing problems of the related art will be described below in detail with reference to FIGS. 1 and 2.

FIG. 1 is a diagram showing one example of a configuration in which a lead pin is bonded to a package substrate according to the related art, and FIG. 2 is a diagram showing another example of a configuration in which a lead pin is bonded to a package substrate according to the related art.

Referring to FIGS. 1 and 2, after a solder paste 12 is applied to a pad part 11 of a package substrate 10, a lead pin 20 is disposed on the pad part 11 of the package substrate 10 so that the head part 21 of the lead pin 20 contacts the pad part 11 thereof. A reflow process of bonding the plurality of lead pins 20 to the pad part 11 of the package substrate 10 is performed. Therefore, the package substrate 10 to which the lead pins 20 are bonded is manufactured.

However, voids 13 may be generated in the solder paste 12 during the process of applying the solder paste 12 to the pad part 11. These voids 13 deteriorate the bonding strength of the lead pin 20 when the lead pins 20 are bonded to the package substrate 10. In addition, as shown in FIG. 2, there is a problem in that the lead pin 20 inclines to one side as the voids 13 are discharged from the solder paste 12.

In addition, a solder paste (Sn95-Sb5, melting point 232 to 240° C.) for bonding the lead pins 20 has a relatively higher melting point, as compared to the solder paste (Sn96-Ag3, 5-X solder, melting point 221° C.) for bonding the IC chips. Therefore, in order to bond the lead pins 20 to the package substrate 10, the reflow process should be performed under a relatively higher temperature condition. However, the reflow process under the high-temperature atmosphere cannot help but be controlled to a shorter time when heating is performed at the temperature exceeding the melting point in order to minimize thermal impact applied to the package substrate 10. Therefore, since the time for the voids 13 to discharge from the solder paste 12 is insufficient, the melting surface of the solder paste 12 itself becomes non-uniform or the tension with the lead pin 20 is caused by the expansion of the voids, such that the reflow process causes the phenomenon where the lead pin 20 is inclined to one side.

SUMMARY OF THE INVENTION

An object of the present invention is to provide a method for manufacturing a package substrate capable of improving bonding reliability of a lead pin.

Another object of the present invention is to provide a method for manufacturing a package substrate capable of improving bonding reliability of a lead pin by effectively discharging flux, voids, etc., which remain in the solder paste, from a solder paste at the time of bonding the lead pin to the package substrate by using the solder paste.

According to an exemplary embodiment of the present invention, there is provided a lead pin for a package substrate, including: a head part having one surface opposite to the package substrate and the other surface that is opposite to the one surface; and a connection pin having a pin shape bonded to the other surface of the head part, wherein the head part has a convex depression part from the one surface toward the other surface.

The depression part may have a dimple shape.

The package substrate may have a pad part formed with a solder bump and the depression part may have a shape corresponding to the solder bump.

According to another exemplary embodiment of the present invention, there is provided a method for manufacturing a package substrate, including: preparing a lead pin including a head part having a concave depression part toward the package substrate on one surface facing the package substrate; forming a solder paste in a lead pin bonding region on the package substrate; a first reflowing forming a solder bump by heat-treating the solder paste; disposing the lead pin on the solder bump in order to lay the depression part on the solder bump; and a second reflowing bonding the lead pin to the package substrate.

The first reflowing may be performed under a first process condition of a temperature atmosphere equal to or higher than a temperature of a melting point of the solder paste, and the second reflowing may be performed under a second process condition of a temperature atmosphere higher than the first temperature condition.

The first process condition may have a temperature condition of 240° C. to 270° C., and the second process condition has a temperature condition of 260° C. to 290° C.

The first reflowing may be controlled to have a process time longer than that of the second reflowing.

The first reflowing may have the process time of 360 seconds or more, and the second reflowing may have the process time of 240 seconds or less.

The first reflowing may include removing flux and voids in the solder paste.

The method for manufacturing the package substrate may further include removing the flux remaining in the lead pin bonding region after the second reflowing.

According to another exemplary embodiment of the present invention, there is provided a method for manufacturing a package substrate, including: preparing a lead pin including a head part having a concave depression part toward the package substrate on one surface facing the package substrate; forming a solder paste in a lead pin bonding region on the package substrate; first removing flux and voids in a solder paste; disposing the lead pin on the solder bump in order to lay the depression part on the solder bump; and second removing the flux remaining around the solder paste.

The first removing the flux may include reflowing the solder paste.

The first removing the flux may include the first reflowing heat-treating the solder paste in order to form the solder bump by melting the solder paste, and the bonding of the lead pin may include the second reflowing heat-treating the solder bump.

The removing the flux may include the first reflowing heat-treating under a first temperature condition equal to or higher than a temperature of a melting point of the solder paste, and the bonding the lead pin may include the second reflowing heat-treating under a second temperature condition higher than the first temperature condition.

The first reflowing may be performed for a time longer than the second reflowing.

The second removing the flux may include performing a wet cleaning process on the lead pin bonding region.

BRIEF DESCRIPTION OF THE DRAWINGS

FIG. 1 is a diagram showing one example of a configuration in which a lead pin is bonded to a package substrate according to the related art;

FIG. 2 is a diagram showing another example of a configuration in which a lead pin is bonded to a package substrate according to the related art;

FIG. 3 is a perspective view of a lead pin for a package substrate according to an exemplary embodiment of the present invention;

FIG. 4 is a side view of the lead pin for the package substrate according to the exemplary embodiment of the present invention;

FIG. 5 is a diagram showing the shape in which the lead pin for the package substrate according to the exemplary embodiment of the present invention is bonded to the package substrate;

FIG. 6 is a flowchart showing a method for manufacturing a package substrate according to an exemplary embodiment of the present invention; and FIGS. 7 to 10 are diagrams for explaining a process of manufacturing the package substrate according to the exemplary embodiment of the present invention.

DESCRIPTION OF THE PREFERRED EMBODIMENTS

Various advantages and features of the present invention and methods accomplishing thereof will become apparent from the following description of embodiments with reference to the accompanying drawings. However, the present invention may be modified in many different forms and it should not be limited to the embodiments set forth herein. Rather, these embodiments may be provided so that this disclosure will be thorough and complete, and will fully convey the scope of the invention to those skilled in the art. Like reference numerals in the drawings denote like elements.

Terms used in the present specification are for explaining the embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

Hereinafter, a lead pin for a package substrate and a method for manufacturing a package substrate with the same will be described in detail reference to the accompanying drawings.

FIG. 3 is a perspective view of a lead pin for a package substrate according to an exemplary embodiment of the present invention and FIG. 4 is a side view of the lead pin for the package substrate according to the exemplary embodiment of the present invention. FIG. 5 is a diagram showing a configuration in which the lead pin for the package substrate according to the exemplary embodiment of the present invention is bonded to the package substrate.

Referring to FIGS. 3 to 5, a lead pin 100 for a package substrate according to an exemplary embodiment of the present invention may be configured to include a head part 110 and a connection pin 120 vertically bonded to the head part 110.

The head part 110 may be a part of the lead pin 100 bonded to a pad part 210 of a package substrate 200. The head part 110 may substantially have a disc shape. The head part 110 may have one surface opposite to the package substrate 200 and the other surface that is opposite side to the one surface. The one surface may be provided with a concave depression part 112 toward the package substrate 200. That is, the depression part 112 may have a convex shape from the one surface opposite to the other surface.

The connection pin 120 may be a portion that is inserted into a socket, or the like, when the lead pin 100 is mounted on the package substrate 200. The connection pin 120 may be vertically bonded to the other surface of the head part 110. The connection pin 120 may be formed in a substantially cylindrical shape having a predetermined length according to a type of package substrate 200. In addition, the connection pin 120 may be formed to protrude toward the top portion of the package substrate 200 when the lead pin 100 is mounted on the package substrate 200.

In this configuration, the depression part 112 of the head part 110 may have a configuration to increase a bonding area with the solder structure 240. That is, the depression part 112 may be provided to have a dimple shape dented toward the inner side of the head part 110. Therefore, the bonding area between the lead pin 100 and the solder structure 240 is increased by the depression part 112, thereby making it possible to improve bonding reliability between the package substrate 200 and the lead pin 100.

As described above, the lead pin 100 for the package substrate according to the exemplary embodiment of the present invention may have the head part 110 bonded to the package substrate 200 and the connection pin 120 vertically bonded to the head part 110, wherein the head part 110 may have the concave depression part 112 toward the package substrate 200. Therefore, the lead pin 100 for the package substrate according to the present invention includes the head part 110 having the depression part 112 to increase the bonding area with the solder structure 240, such that it may have the configuration to improve bonding reliability with the package substrate 200.

Next, a process of bonding the lead pin of the package substrate according to the exemplary embodiment of the present invention will be described in detail. Herein, a repeated description of the lead pin for the package substrate as described above may be omitted or simplified.

FIG. 6 is a flowchart showing a method for manufacturing a package substrate according to an exemplary embodiment of the present invention and FIGS. 7 to 9 are drawings for explaining a process of manufacturing a package substrate according to an exemplary embodiment of the present invention.

Referring to FIGS. 6 and 7, a solder paste 220 may be formed on the package substrate 200 (S110). For example, the package substrate 200 including the pad part 210 may be prepared. The step of preparing the package substrate 200 may include preparing a predetermined circuit substrate for packaging an integrated circuit chip. The circuit substrate may be a printed circuit board (PCB). The pad part 210 may be a lead pin bonding region of the package substrate 200 to which the lead pin (100 of FIG. 9) is bonded in a subsequent process.

The solder paste 220 may be printed on the pad part 210 of the package substrate 220. The solder paste 220 may be particle compositions composed of an alloy made of lead (Pb), zinc (Zn), and silver (Ag). In this case, the solder paste 220 may be particle compositions including flux. Alternatively, a step of forming the solder paste 220 may separately apply the flux to the pad part 210 of the package substrate 200.

Referring to FIGS. 6 and 8, a first reflow process removing the flux and voids in the solder paste (220 of FIG. 4) may be performed (S120). A step of the first reflow process may be performed by heat-treating the solder paste 220 under a first process condition of a temperature atmosphere approximating or slightly higher to or than a melting point of the solder paste 220. For example, the solder paste used to manufacture a pin grid array package substrate may have a melting point higher than that of the solder paste used for bonding of the integrated circuit chip (IC). Therefore, the solder paste 220 used for bonding the lead pin (100 of FIG. 9) may have the melting point of about 230° C. to 250° C. Therefore, the first reflow process may include heat-treating the solder paste 220 under the temperature atmosphere of approximately 240° C. to 270° C.

In addition, the first reflow process may be performed for a process time of approximately 340 seconds or more. In the general reflow process for bonding the lead pin, the bonding of the lead pin is made within a process time of approximately 240 seconds or less. On the other hand, in the first reflow process, the reflow process time may be controlled to be a long process time of 360 seconds or more. This is to discharge the flux and voids in the solder paste 220 from the solder paste 220. In other words, when the solder paste 220 is reflowed under the temperature atmosphere exceeding 240° C. and the process time of 240 seconds or less, the flux and voids in the solder paste 220 are not discharged from the solder paste 220 but confined in the solder paste 220, such that they will remain in the solder paste 220. In order to prevent this, the first reflow process may control the process time to 340 seconds or more in order to sufficiently secure the time needed for the flux and voids in the solder paste 220 to be discharged.

When the first reflow process is performed under the foregoing first process conditions, most flux and voids in the solder paste 220 are discharged, such that the solder paste 220 may be formed as a solder bump 230 having a convex shape toward the outside. Therefore, the solder bump 230 is very small in terms of residual substances, such as flux, and a residual amount of voids, such that it may have a dense composition.

Referring to FIGS. 6 and 9, the lead pin 100 may be disposed on the solder bump 230 (S130). The lead pin 100 for the package substrate having a structure including the head part 110 and the connection pin 120 as described above with reference to FIGS. 3 to 5 may be prepared. The package substrate 200 and the lead pin 100 may be aligned so that the depression part 112 of the head part 110 is laid on the solder bump 230 formed on the package substrate 200. To this end, the depression part 112 may be machined to have a shape corresponding to the shape of the solder bump 230. In more detail, by the first reflow process as described above, the solder paste 220 printed on the pad part 210 of the package substrate 200 may be formed as the solder bump 230 having a convex shape toward the outside of the pad part 210. In this case, in order to improve the bonding efficiency between the solder bump 230 and the lead pin 100, it is preferable to control a curvature of the depression part 112 so that the depression part 112 of the head part 100 is laid on the solder bump 230. To this end, in the above-mentioned process of preparing the lead pin 100 for the package substrate, the curvature of the depression part 112 of the head part 100 may be controlled in consideration of the shape of the solder bump 230.

Referring to FIGS. 6 and 10, a second reflow process of bonding the lead pin 100 to the package substrate 200 may be performed (S140). For example, a step of the second reflow process may include heat-treating under a second process condition of a temperature atmosphere that is higher by approximately lot to 40° C. than the melting point of the solder bump 230. In this case, the solder bump 230 is a state obtained by being melted and then solidified by performing the reflow process on the solder paste (220 of FIG. 5) once, such that it may have a melting point slightly higher than that of the solder paste 220. For example, the melting point of the solder bump 230 may have a melting point of approximately 240° C. to 250° C. Therefore, the second reflow process may include heat-treating the solder bump 230 under the temperature atmosphere of approximately 260° C. to 290° C.

In addition, the second reflow process may be performed for the process time shorter than that of the first reflow process time. For example, the second reflow process may be controlled to have the process time of approximately 240 seconds or less. The reason is that it is advantageous in shortening the bonding process time when controlling the process time for bonding the lead pin 100 to be at the minimum in the second reflow process since the flux and voids in the solder bump 230 are removed in the foregoing first reflow process. In addition, since the second reflow process is performed under the relatively higher temperature atmosphere than the first reflow process, it should be performed for a minimum process time in order to reduce the thermal impact applied to the package substrate 200.

In this case, after the second reflow process, a second flux removing step of removing a residual flux in the lead pin bonding region of the package substrate 200 may be further provided. The second flux removing step may be made by performing a predetermined wet cleaning process on the pad part 210 of the package substrate 200.

Due to the structure of the above-mentioned lead pin 100, the solder bump 230 is expanded into the depression part 112 of the head part 110 and may be formed a solder structure 240 having a structure surrounding a circumference of the head part 110.

As described above, the method for manufacturing the package substrate according to the exemplary embodiment of the present invention may prepare the lead pin 100, form the solder paste 220 on the package substrate 200, perform the first reflow process on the solder paste 220 to previously form the solder bump 230 from which the flux and voids are removed, and perform the second reflow process of bonding the lead pin 100 to the package substrate 200. Therefore, the method for manufacturing the package substrate according to the present invention can bond the lead pin 100 to the solder bump 230 in the state where the flux and voids are removed, thereby making it possible to improve the bonding reliability of the lead pin.

The method for manufacturing the package substrate according to the exemplary embodiment of the present invention may prepare the lead pin 100 including the head part 110 having the depression part 112 in a concave shape on one surface facing the package substrate 200, form the solder paste 220 on the package substrate 200, perform the first reflow process on the solder paste 220 to previously form the solder bump 230 from which the flux and voids are removed, dispose the lead pin 100 on the solder bump 230 to laid the depression part 112 on the solder bump 230, and then, perform the second reflow process bonding the lead pin 100 to the package substrate 200. Therefore, the method for manufacturing the package substrate according to the present invention bonds the lead pin 100 to the solder bump 230 in the state where the depression part 112 is laid on the solder bump 230 to increase the bonding efficiency between the solder bump 230 and the lead pin 100, thereby making it possible to improve bonding reliability between the package substrate 200 and the lead pin 100.

In addition, the method for manufacturing the package substrate according to the exemplary embodiment of the present invention removes the flux and voids, thereby making it possible to bond the lead pin 100 to the solder bump 230 having a dense composition. Therefore, the method for manufacturing the package substrate according to the present invention can increase the bonding strength between the package substrate 200 and the lead pin 100.

According to the present invention, the lead pin for the package substrate is configured to include the head part bonded to the package substrate and the connection pins vertically bonded to the head part, wherein the head part may have a concave depression part toward the package substrate. Therefore, the lead pin for the package substrate according to the present invention includes the head part having the depression part increasing the bonding area with the solder structure, thereby making it possible to implement the structure where bonding reliability with the package substrate is improved.

The method for manufacturing the package substrate according to the present invention may form the solder paste on the package substrate, perform the first reflow process on the solder paste to previously form the solder bump from which the flux and voids are removed, and then, perform the second reflow process of bonding the lead pin to the solder bump. Therefore, the method for manufacturing the package substrate according to the present invention bonds the lead pin to the solder bump from which the flux and voids are removed, thereby making it possible to improve the bonding reliability of the lead pin.

The method for manufacturing the package substrate according to the exemplary embodiments of the present invention may prepare the lead pin including the head part having the concave depression part on one surface facing the package substrate, perform the first reflow process on the solder paste applied to the package substrate to previously form the solder bump from which the flux and voids are removed, dispose the lead pin on the solder bump to laid the depression part on the solder bump, and then, perform the second reflow process of bonding the package substrate to the lead pin. Therefore, the method for manufacturing the package substrate according to the present invention bonds the lead pin to the solder bump in the state where the depression part is laid on the solder bump to increase the bonding efficiency between the solder bump and the lead pin, thereby making it possible to improve bonding reliability between the package substrate and the lead pin.

The method for manufacturing the package substrate according to the present invention bonds the lead pin to the solder bump from which the flux and voids are removed, thereby making it possible to bond the lead pin to the solder bump having a dense composition. Therefore, the lead pin for manufacturing the package substrate according to the present invention increases the bonding strength between the package substrate and the lead pin, thereby making it possible to improve the bonding reliability of the lead pin.

The present invention has been described in connection with what is presently considered to be practical exemplary embodiments. Although the exemplary embodiments of the present invention have been described, the present invention may be also used in various other combinations, modifications and environments. In other words, the present invention may be changed or modified within the range of concept of the invention disclosed in the specification, the range equivalent to the disclosure and/or the range of the technology or knowledge in the field to which the present invention pertains. The exemplary embodiments described above have been provided to explain the best state in carrying out the present invention. Therefore, they may be carried out in other states known to the field to which the present invention pertains in using other inventions such as the present invention and also be modified in various forms required in specific application fields and usages of the invention. Therefore, it is to be understood that the invention is not limited to the disclosed embodiments. It is to be understood that other embodiments are also included within the spirit and scope of the appended claims.

What is claimed is:

1. A lead pin for a package substrate, comprising:
a head part having one surface opposite to the package substrate and the other surface that is an opposite side to the one surface; and
a connection pin having a pin shape bonded to the other surface of the head part,
wherein the head part has a convex depression part from the one surface toward the other surface.

2. The lead pin for the package substrate according to claim 1, wherein the depression part has a dimple shape.

3. The lead pin for the package substrate according to claim 1, wherein the package substrate has a pad part formed with a solder bump and
the depression part has a shape corresponding to the solder bump.

4. A method for manufacturing a package substrate, comprising:
preparing a lead pin including a head part having a concave depression part toward the package substrate on one surface facing the package substrate;
forming a solder paste in a lead pin bonding region on the package substrate;
first reflowing forming a solder bump by heat-treating the solder paste;
disposing the lead pin on the solder bump in order to lay the depression part on the solder bump; and
second reflowing bonding the lead pin to the package substrate.

5. The method for manufacturing the package substrate according to claim 4, wherein the first reflowing is performed under a first process condition of a temperature atmosphere equal to or higher than a temperature of a melting point of the solder paste, and
the second reflowing is performed under a second process condition of a temperature atmosphere higher than the first temperature condition.

6. The method for manufacturing the package substrate according to claim 5, wherein the first process condition has a temperature condition of 240° C. to 270° C., and the second process condition has a temperature condition of 260° C. to 290° C.

7. The method for manufacturing the package substrate according to claim 4, wherein the first reflowing is controlled to have a process time longer than that of the second reflowing.

8. The method for manufacturing the package substrate according to claim 7, wherein the first reflowing is performed for the process time of 360 seconds or more, and
the second reflowing is performed for the process time of 240 seconds or less.

9. The method for manufacturing the package substrate according to claim 4, wherein the first reflowing includes removing flux and voids in the solder paste.

10. The method for manufacturing the package substrate according to claim 4, further comprising removing the flux remaining in the lead pin bonding region after the second reflowing.

11. A method for manufacturing a package substrate, comprising:
preparing a lead pin including a head part having a concave depression part toward the package substrate on one surface facing the package substrate;
forming a solder paste in a lead pin bonding region on the package substrate;
first removing flux and voids in a solder paste;
disposing the lead pin on the solder bump in order to lay the depression part on the solder bump; and
second removing the flux remaining around the solder paste.

12. The method for manufacturing a package substrate according to claim 11, wherein the first removing the flux includes reflowing the solder paste.

13. The method for manufacturing a package substrate according to claim 11, wherein the first removing the flux includes first reflowing heat-treating the solder paste in order to form the solder bump by melting the solder paste, and
the bonding the lead pin includes second reflowing heat-treating the solder bump.

14. The method for manufacturing a package substrate according to claim 11, wherein the first removing the flux includes the first reflowing heat-treating under a first temperature condition equal to or higher than a temperature of a melting point of the solder paste, and
the bonding the lead pin includes the second reflowing heat-treating under a second temperature condition higher than the first temperature condition.

15. The method for manufacturing a package substrate according to claim 11, wherein the first reflowing is performed for a time longer than the second reflowing.

16. The method for manufacturing a package substrate according to claim 11, wherein the second removing the flux includes performing a wet cleaning process on the lead pin bonding region.

* * * * *

UNITED STATES PATENT AND TRADEMARK OFFICE
CERTIFICATE OF CORRECTION

PATENT NO. : 8,159,064 B2
APPLICATION NO. : 12/926626
DATED : April 17, 2012
INVENTOR(S) : Heung Jae Oh et al.

Page 1 of 1

It is certified that error appears in the above-identified patent and that said Letters Patent is hereby corrected as shown below:

Column 9, Line 8, In Claim 4, delete "ref lowing" and insert -- reflowing --, therefor.

Signed and Sealed this
Twenty-eighth Day of August, 2012

David J. Kappos
*Director of the United States Patent and Trademark Office*